US011730030B2

(12) United States Patent
You et al.

(10) Patent No.: US 11,730,030 B2
(45) Date of Patent: Aug. 15, 2023

(54) DISPLAY DEVICE HAVING A FIRST WIRING AT A SAME LAYER AS A LOWER METAL LAYER AND ELECTRONIC DEVICE INCLUDING THE SAME

(71) Applicant: Samsung Display Co., Ltd., Yongin-si (KR)

(72) Inventors: Chungi You, Yongin-si (KR); Hyounghak Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 169 days.

(21) Appl. No.: 17/206,671

(22) Filed: Mar. 19, 2021

(65) Prior Publication Data
US 2021/0359074 A1 Nov. 18, 2021

(30) Foreign Application Priority Data
May 13, 2020 (KR) .......................... 10-2020-0057192

(51) Int. Cl.
| | |
|---|---|
| *H01L 29/08* | (2006.01) |
| *H10K 59/131* | (2023.01) |
| *H10K 59/65* | (2023.01) |
| *H10K 59/126* | (2023.01) |
| *H10K 59/121* | (2023.01) |

(52) U.S. Cl.
CPC ......... *H10K 59/131* (2023.02); *H10K 59/126* (2023.02); *H10K 59/1213* (2023.02); *H10K 59/1216* (2023.02); *H10K 59/65* (2023.02)

(58) Field of Classification Search
CPC ............ H01L 27/3276; H01L 27/3234; H01L 27/3262; H01L 27/3265; H01L 27/3272

USPC .......................................................... 257/40
See application file for complete search history.

(56) References Cited

U.S. PATENT DOCUMENTS

| | | | |
|---|---|---|---|
| 8,068,674 B2 | 11/2011 | Goncalves | |
| 2018/0070460 A1* | 3/2018 | Han ...................... | G06F 1/1626 |
| 2019/0081125 A1* | 3/2019 | Murai ............... | H01L 29/41733 |
| 2019/0165073 A1* | 5/2019 | Jeong .................. | H01L 27/3265 |
| 2019/0198801 A1* | 6/2019 | Kuon .................. | H01L 51/5246 |

(Continued)

FOREIGN PATENT DOCUMENTS

| | | |
|---|---|---|
| KR | 10-2017-0080754 A | 7/2017 |
| KR | 10-2019-0012706 A | 2/2019 |

(Continued)

*Primary Examiner* — Phuc T Dang
(74) *Attorney, Agent, or Firm* — Lewis Roca Rothgerber Christie LLP

(57) ABSTRACT

A display device includes: pixel circuits in a display area, the pixel circuits each comprising a thin film transistor and a capacitor, the thin film transistor including a semiconductor layer and a gate electrode on the substrate and the capacitor including a first capacitor plate and a second capacitor plate; signal lines electrically connected to the pixel circuits, the signal lines passing through the display area; a lower metal layer between the substrate and at least one of the pixel circuits; a pad portion in the peripheral area; and a plurality of wirings in the peripheral area, the plurality of wirings electrically connecting the pad portion to the signal lines, wherein the plurality of wirings further comprise: a first wiring at a same layer as the lower metal layer; and a second wiring above the first wiring with a first insulating layer between the first wiring and the second wiring.

19 Claims, 13 Drawing Sheets

(56) References Cited

U.S. PATENT DOCUMENTS

| | | | |
|---|---|---|---|
| 2019/0348489 A1 | 11/2019 | Na et al. | |
| 2020/0006697 A1* | 1/2020 | Jung | ............... H01L 27/3246 |
| 2020/0027943 A1* | 1/2020 | Kim | ............... H01L 51/5253 |
| 2020/0044008 A1 | 2/2020 | Lee et al. | |

FOREIGN PATENT DOCUMENTS

| | | |
|---|---|---|
| KR | 10-2019-0130707 A | 11/2019 |
| KR | 10-2020-0014473 A | 2/2020 |

* cited by examiner

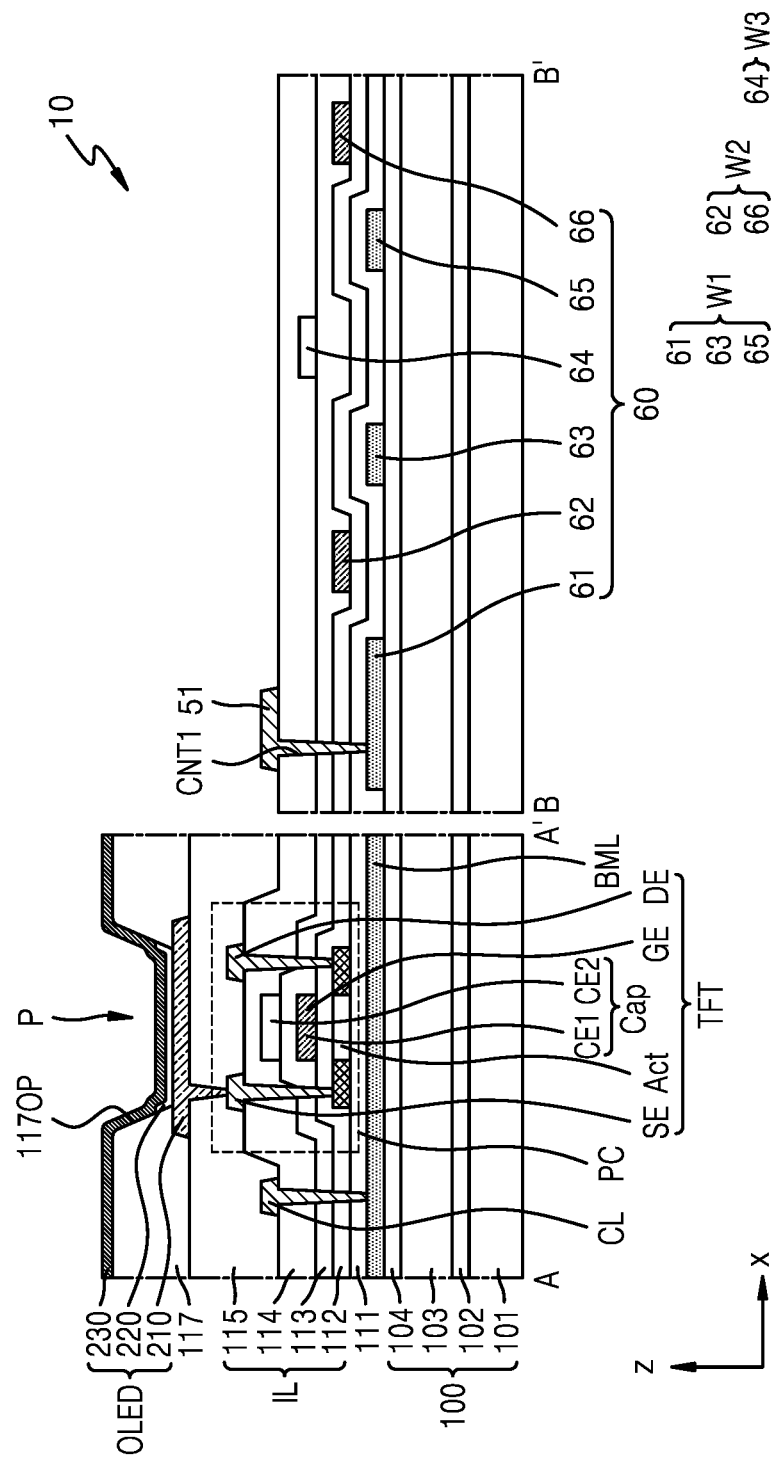

DISPLAY DEVICE HAVING A FIRST WIRING AT A SAME LAYER AS A LOWER METAL LAYER AND ELECTRONIC DEVICE INCLUDING THE SAME

CROSS-REFERENCE TO RELATED APPLICATION

This application claims priority to and the benefit of Korean Patent Application 10-2020-0057192, filed on May 13, 2020, in the Korean Intellectual Property Office, the disclosure of which is incorporated by reference herein in its entirety.

BACKGROUND

1. Field

Aspects of one or more example embodiments relate to a display device and an electronic device including the display device.

2. Description of Related Art

A display device displays data visually. Such a display device may include a display area and a peripheral area adjacent to the display area. In the display area, scan lines and data lines are generally insulated from each other, and a plurality of light-emitting elements connected to the scan lines and the data lines are arranged in the display area. The peripheral area may include various lines/wirings for transferring electrical signals to the display area, a scan driver, a data driver, a controller, etc.

A dead space may be created due to wirings arranged in the peripheral area. Additionally, in a display device, various functions added to or linked to a display device are being added while there is also a desire to increase the display area. As a method of adding various functions while increasing an area, research into a display device having an area for providing other various functions other than merely displaying images in a display area has been continuously conducted.

The above information disclosed in this Background section is only for enhancement of understanding of the background and therefore the information discussed in this Background section does not necessarily constitute prior art.

SUMMARY

Aspects of one or more example embodiments relate to a display device and an electronic device including the display device, and for example, to a display device including a fan-out wiring and a lower metal layer and an electronic device including the display device.

Aspects of one or more example embodiments include a display device, in which a dead space due to a fan-out wiring portion in a peripheral area is reduced and defects caused by short-circuits between the fan-out wirings may be prevented or reduced, and an electronic device including the display device. However, the above technical characteristics are merely examples, and the scope of embodiments according to the present disclosure is not limited thereto.

Additional aspects will be set forth in part in the description which follows and, in part, will be apparent from the description, or may be learned by practice of the presented example embodiments of the disclosure.

According to one or more example embodiments, a display device includes a display area and a peripheral area adjacent to the display area, wherein the display device includes a substrate, pixel circuits in the display area, the pixel circuits each including a thin film transistor including a semiconductor layer and a gate electrode on the substrate and a capacitor including a first capacitor plate and a second capacitor plate, signal lines electrically connected to the pixel circuits and passing through the display area, a lower metal layer between the substrate and at least one of the pixel circuits, a pad portion in the peripheral area, and a plurality of wirings in the peripheral area for electrically connecting the pad portion to the signal lines, the plurality of wirings further include a first wiring at a same layer as the lower metal layer, and a second wiring above the first wiring with a first insulating layer between the first wiring and the second wiring.

According to some example embodiments, the first wiring may include a material that is same as a material included in the lower metal layer.

According to some example embodiments, the second wiring may include a material that is same as a material included in the gate electrode, the first capacitor plate, or the second capacitor plate.

According to some example embodiments, a first portion of the first insulating layer may be between the first wiring and the second wiring, and a second portion of the first insulating layer may be between the substrate and the pixel circuits.

According to some example embodiments, the plurality of wirings may include molybdenum (Mo) and/or titanium (Ti).

According to some example embodiments, the first wiring and the second wiring may overlap each other.

According to some example embodiments, a lower surface of the second wiring may be farther from the substrate than an upper surface of the first wiring.

According to some example embodiments, the first insulating layer may include an inorganic insulating material.

According to some example embodiments, the plurality of wirings may further include a third wiring above the second wiring with a second insulating layer between the second wiring and the third wiring.

According to some example embodiments, the second wiring may include a material that is same as a material included in the gate electrode or the first capacitor plate, and the third wiring may include a material that is same as a material included in the second capacitor plate.

According to some example embodiments, the second insulating layer may include an inorganic insulating material.

According to some example embodiments, in a plan view, the first wiring may be between the second wiring and the third wiring that are adjacent to each other.

According to some example embodiments, the thin film transistor of at least one of the pixel circuits may include a semiconductor layer, a gate electrode overlapping a channel region of the semiconductor layer, and an electrode connected to a source region or a drain region that are at opposite sides of the channel region in the semiconductor layer, and the lower metal layer may be electrically connected to the electrode.

According to one or more example embodiments, an electronic device includes a display device including a display area and a peripheral area adjacent to the display area, the display area including a transmission area, and an electronic component at least overlapping the transmission area, wherein the display device includes a substrate, a first pixel circuit and a second pixel circuit each comprising a thin film transistor and a storage capacitor, the first pixel circuit and the second pixel circuit being apart from each other with the transmission area therebetween on the display area, a first light-emitting element and a second light-emitting element that are electrically connected to the first pixel circuit and the second pixel circuit respectively, a lower metal layer under the first pixel circuit and the second pixel circuit, a plurality of signal lines passing through the display area, the plurality of signal lines including a first signal line and a second signal line applying electrical signals respectively to the first pixel circuit and the second pixel circuit, a pad in the peripheral area, and a plurality of wirings in the peripheral area, the plurality of wirings electrically connecting the plurality of signal lines to the pad, the plurality of wirings include a first wiring including a material that is same as a material included in the lower metal layer, and a second wiring on the first wiring.

According to some example embodiments, the electronic device may further include at least one insulating layer between the first wiring and the second wiring, wherein a portion of the at least one insulating layer may be between the substrate and the first and second pixel circuits.

According to some example embodiments, the thin film transistor may include a semiconductor layer and a gate electrode overlapping the semiconductor layer, the storage capacitor may include a first capacitor plate and a second capacitor plate overlapping each other, and the second wiring may include a material that is same as a material included in the gate electrode, the first capacitor plate, or the second capacitor plate.

According to some example embodiments, the first wiring and the second wiring may overlap each other.

According to some example embodiments, the plurality of wirings may include molybdenum (Mo) and/or titanium (Ti).

According to some example embodiments, the plurality of wirings may further include a third wiring on the first wiring and the second wiring, the second wiring may include a material that is same as a material included in the gate electrode or the first capacitor plate, and the third wiring may include a material that is same as a material included in the second capacitor plate.

According to some example embodiments, in a plan view, the first wiring may be between the second wiring and the third wiring that are adjacent to each other.

Other aspects, features and characteristics of embodiments according to the present disclosure will become better understood through the accompanying drawings, the claims and the detailed description.

BRIEF DESCRIPTION OF THE DRAWINGS

The above and other aspects, features, and characteristics of certain example embodiments of the disclosure will be more apparent from the following description taken in conjunction with the accompanying drawings, in which:

FIGS. 8A to 8C are cross-sectional views of a portion of a display device according to some example embodiments;

DETAILED DESCRIPTION

Figure 1:
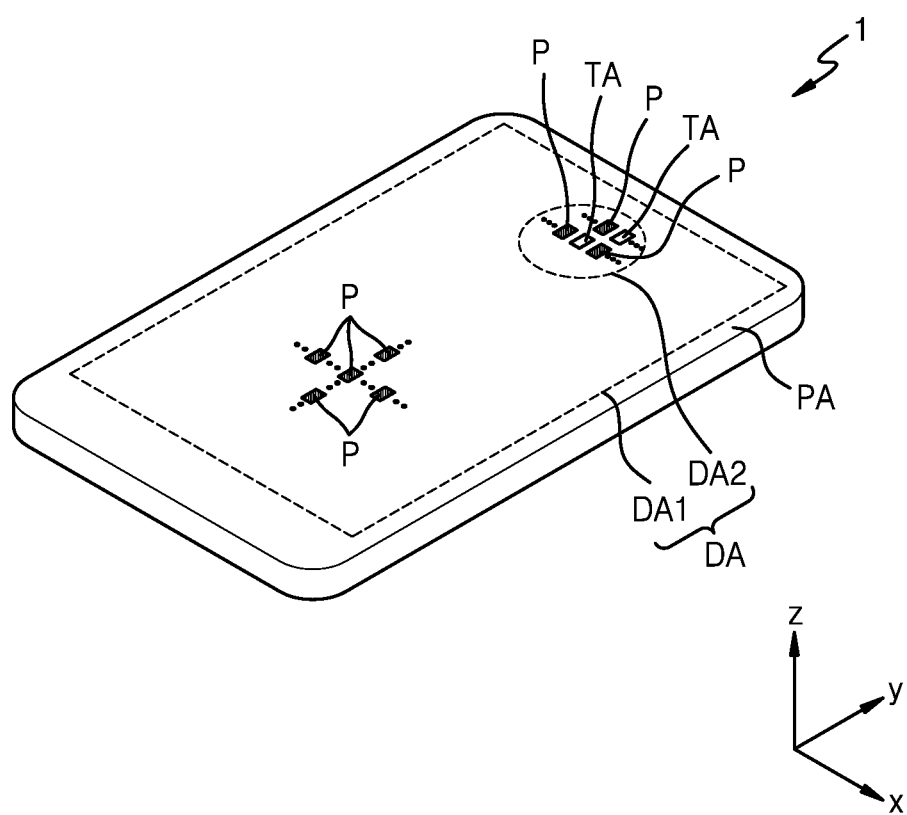
FIG. 1 is a perspective view of an electronic device including a display device according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, example embodiments will be illustrated in the drawings and described in more detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the example embodiments described below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of an electronic device 1 including a display device according to some example embodiments.

Referring to FIG. 1, the electronic device 1 may include a display area DA and a peripheral area PA adjacent to the display area DA. The electronic device 1 may provide or display images via arrays of a plurality of pixels P arranged in the display area DA.

The plurality of pixels P may be in a first display area DA1 and a second display area DA2, and arrays of the plurality of pixels P in the first display area DA1 and the second display area DA2 may be different from each other. For example, a transmission area TA is between the plurality of pixels P in the second display area DA2, that is, the array of the pixels P in the second display area DA2 may be different from the array of the pixels P in the first display area DA1.

The electronic device 1 may provide a first image by using light emitted from the pixels P in the first display area DA1, and may provide a second image by using light emitted from the pixels P in the second display area DA2. According to some example embodiments, the first image and the second image may be parts of one image provided through the display area DA of the electronic device 1. Alternatively, according to some example embodiments, the electronic device 1 may provide the first image and the second image that are independent from each other.

The second display area DA2 may include the transmission area TA between the pixels P. The transmission area TA may transmit light, and does not include pixels.

The peripheral area PA is a non-display area that does not provide images and may partially or entirely surround the display area DA. Drivers, etc. for providing electrical signals or electric power to the display area DA may be in the peripheral area PA. The peripheral area PA may include a pad that is a region to which an electronic device, a printed circuit board, etc. may be electrically connected.

The second display area DA2 may have a circular shape or an elliptical shape in a plan view (e.g., when viewed from a direction perpendicular or normal with respect to a plane of the display surface) as shown in FIG. 1, although embodiments according to the present disclosure are not limited thereto. For example, according to some example embodiments, the second display area DA2 may have a polygonal shape such as a rectangular shape or a bar shape.

The second display area DA2 may be inside the first display area DA1 or at a side of the first display area DA1. As shown in FIG. 1, the second display area DA2 may be entirely surrounded by the first display area DA1. According to some example embodiments, the second display area DA2 may be partially surrounded by the first display area DA1. For example, the second display area DA2 may be at a side corner portion of the first display area DA1 and may be partially surrounded by the first display area DA1.

A ratio of the second display area DA2 with respect to the display area DA may be less than that of the first display area DA1 with respect to the display area DA. The electronic device 1 may include one second display area DA2 as shown in FIG. 1, or may include two or more second display areas DA2.

The electronic device 1 may have a rectangular shape having round corners on a plane as shown in FIG. 1, but embodiments are not limited thereto. The electronic device 1 may have various shapes, e.g., a polygonal shape, a circular shape, an elliptical shape, etc.

The electronic device 1 may include a mobile phone, a tablet PC, a laptop computer, a smart watch or a smart band worn on a wrist, an electronic device for vehicles, etc.

Figure 2:
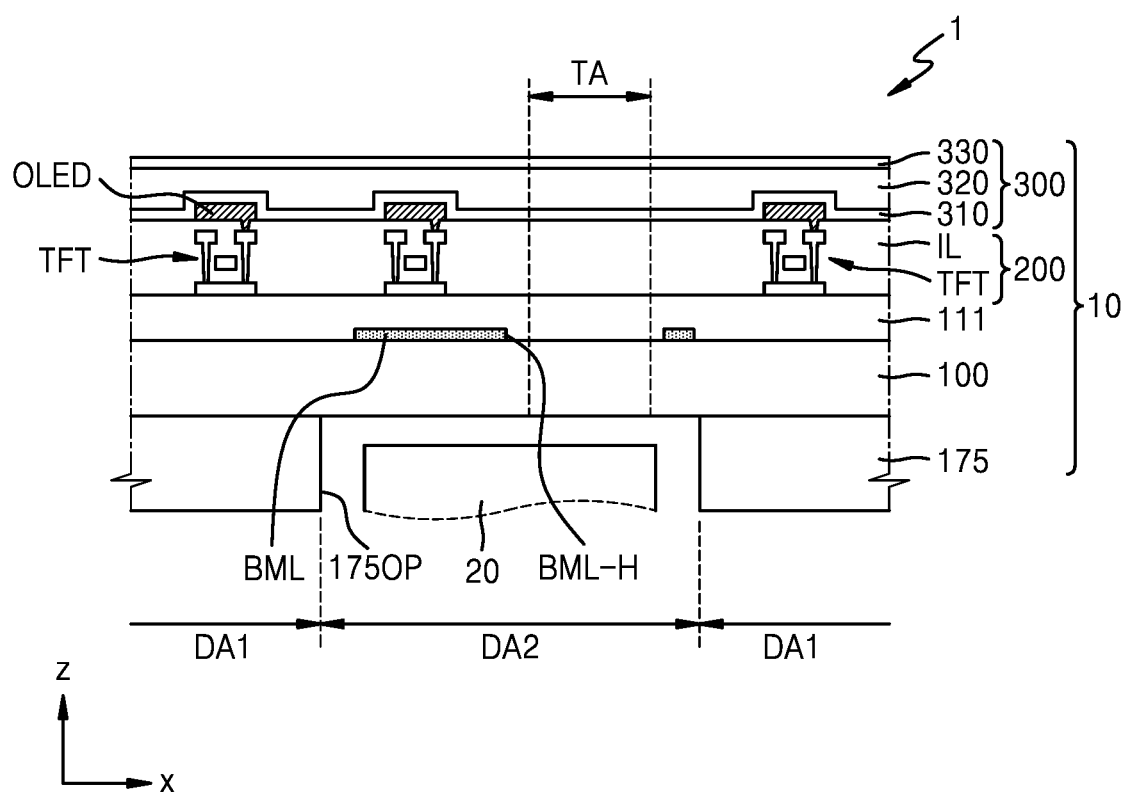
FIG. 2 is a cross-sectional view showing a portion of an electronic device according to some example embodiments.

FIG. 2 is a cross-sectional view showing a portion of the electronic device 1 according to some example embodiments.

Referring to FIG. 2, the electronic device 1 may include a display device 10 and an electronic component 20 arranged overlapping the display device 10.

The display device 10 may include a substrate 100, a display layer 200 on the substrate 100, and a thin film encapsulation layer 300 on the display layer 200.

The electronic component 20 may be in the second display area DA2. The electronic component 20 may include an electronic element using light or sound. For example, the electronic element may include a sensor for measuring a distance such as a proximity sensor, a sensor for sensing a body part of a user (e.g., a fingerprint, an iris, a face, etc.), a small-sized lamp outputting light, an image sensor for capturing an image (e.g., camera), etc. The electronic element using light may use light of various wavelength bands such as visible light, infrared rays, ultraviolet rays, etc. The electronic element using sound may use ultrasound waves or sound of another frequency band. According to some example embodiments, the electronic component 20 may include sub-components such as a light emitter and a light receiver. The light emitter and the light receiver may have an integrated structure or may have a physically separated structure, and a pair of the light emitter and the light receiver may configure the electronic component 20.

The substrate 100 may include glass or a polymer resin. For example, when the substrate 100 includes a polymer resin, the polymer resin may include a polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc. The substrate 100 including the polymer resin may be flexible, rollable, or bendable. The substrate 100 may have a multi-layered structure including a layer including the polymer resin stated above and an inorganic layer.

The displayer layer 200 is on a front surface of the substrate 100, and a lower protective film 175 may be on a rear surface of the substrate 100. The lower protective film 175 may be attached to the rear surface of the substrate 100. An adhesive layer may be between the lower protective film 175 and the substrate 100. Alternatively, the lower protective film 175 may be directly on the rear surface of the substrate 100, and in this case, an adhesive layer may not be provided between the lower protective film 175 and the substrate 100.

The lower protective film 175 may support and protect the substrate 100. The lower protective film 175 may include an opening 175OP corresponding to the second display area DA2 or may not include the opening 175OP. The opening 175OP of the lower protective film 175 is a concave portion obtained by partially removing the lower protective film 175 to a certain depth. According to some example embodiments, the opening 175OP of the lower protective film 175 may be obtained by entirely removing a part of the lower protective film 175 in a thickness direction thereof, and in this case, the opening 175OP may have a through-hole shape as shown in FIG. 2. According to some example embodiments, the opening 175OP of the lower protective film 175 may be obtained as a blind-hole by partially removing the lower protective film 175 in the thickness direction thereof.

When the lower protective film 175 includes the opening 175OP, a transmittance of the second display area DA2, e.g., a light transmittance of the transmission area TA, may be improved. The lower protective film 175 may include an organic insulating material such as polyethylene terephthalate (PET) or polyimide (PI).

The display layer 200 may include a light-emitting diode as a light-emitting element. The light-emitting diode may include, for example, an organic light-emitting diode OLED. The display layer 200 may include a thin film transistor TFT and an insulating layer IL electrically connected to the organic light-emitting diode OLED. The organic light-emitting diode OLED may emit light of different colors, e.g., red light, green light, or blue light, according to a kind of an organic material included therein. Each of the first display area DA1 and the second display area DA2 may include the thin film transistor TFT and the organic light-emitting diode OLED electrically connected to the thin film transistor TFT. The light-emitting element of the display layer 200 emits light through an emission area, and the emission area may be defined as a pixel P. Therefore, the pixel may be defined as an area emitting, for example, red light, green light, or blue light.

The second display area DA2 may include the transmission area TA in which the thin film transistor TFT and the organic light-emitting diode OLED are not arranged. The transmission area TA may be an area through which light emitted from and/or emitted to the electronic component 20. In the display device 10, a transmittance of the transmission area TA may be about 30% or greater, about 40% or greater, about 50% or greater, about 60% or greater, about 75% or greater, about 80% or greater, about 85% or greater, or about 90% or greater.

A lower metal layer BML may be between the substrate 100 and the display layer 200, for example, between the substrate 100 and the thin film transistor TFT. The lower metal layer BML may include a through hole BML-H, through which the light may be emitted or transmitted from or towards the electronic component 20. The through hole BML-H of the lower metal layer BML may be in the transmission area TA. The lower metal layer BML may prevent or reduce the light emitted from or reflected by the electronic component 20 being incident to the thin film transistor TFT in the second display area DA2. As such, degradation in performance of the thin film transistor TFT may be prevented or reduced.

The display layer 200 may be encapsulated by an encapsulation member. The encapsulation member may include a thin film encapsulation layer including an inorganic insulating material and an organic insulating material, or a substrate having a rigid material such as Encap Glass. According to some example embodiments, the encapsulation member may include the thin film encapsulation layer 300 as shown in FIG. 2. The thin film encapsulation layer 300 may include at least one inorganic encapsulation layer and at least one organic encapsulation layer. According to some example embodiments, the thin film encapsulation layer 300 may include first and second inorganic encapsulation layers 310 and 330, and an organic encapsulation layer 320 between the first and second inorganic encapsulation layers 310 and 330.

One or a plurality of electronic components 20 may be in the second display area DA2. When the electronic device 1 includes the plurality of electronic components 20, the electronic device 1 may include second display areas DA2, the number of which corresponds to the number of electronic components 20. For example, the electronic device 1 may include a plurality of second display areas DA2 that are apart from one another. According to some example embodiments, the plurality of electronic components 20 may be in one second display area DA2. For example, the electronic device 1 may include the second display area DA2 of a bar type, and the plurality of electronic components 20 may be apart from one another in a lengthwise direction of the second display area DA2.

In FIG. 2, the display device 10 includes the organic light-emitting diode OLED as the light-emitting element, but the display device 10 of embodiments according to the disclosure is not limited thereto. According to some example embodiments, the display device 10 may include an inorganic light-emitting display (or an inorganic EL display apparatus) including an inorganic material such as a micro LED, a quantum dot light-emitting display apparatus, or an organic-inorganic composite light-emitting display apparatus.

Figure 3:
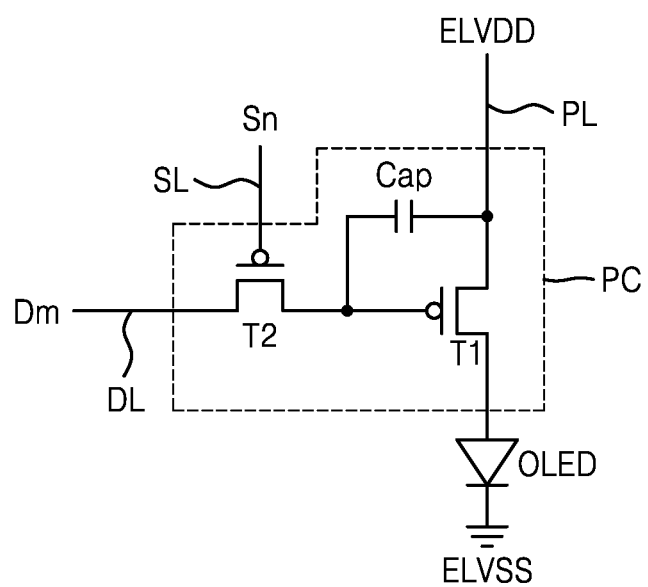
FIG. 3 is an equivalent circuit diagram of a pixel circuit connected to a light-emitting elements of a display device according to some example embodiments.

FIG. 3 is an equivalent circuit diagram of a pixel circuit PC connected to a light-emitting element of the display device 10 according to some example embodiments.

Referring to FIG. 3, the display device 10 may include the pixel circuit PC and the organic light-emitting diode OLED which emits light by receiving a driving voltage via the pixel circuit PC.

The pixel circuit PC may include a plurality of thin film transistors and a storage capacitor. According to some example embodiments, the pixel circuit PC may include a first thin film transistor T1, a second thin film transistor T2, and a storage capacitor Cap as shown in FIG. 3. According to some example embodiments, the first thin film transistor T1 may be a driving TFT and the second thin film transistor T2 may be a switching TFT. The second thin film transistor T2 is connected to a scan line SL and a data line DL, and is configured to transfer to the first thin film transistor T1 a data signal Dm input through the data line DL according to a scan signal Sn input through the scan line SL.

The storage capacitor Cap is connected to the second thin film transistor T2 and a driving voltage line PL, and may store a voltage corresponding to a difference between a first voltage (e.g., driving voltage ELVDD) applied to the driving voltage line PL and a second voltage applied to the second thin film transistor T2.

The first thin film transistor T1 is connected to the driving voltage line PL and the storage capacitor Cap and may control a driving current flowing from the driving voltage line PL to the organic light-emitting diode OLED in response to the voltage value stored in the storage capacitor Cap. An opposite electrode of the organic light-emitting diode OLED is connected to a common voltage ELVSS. The organic light-emitting diode OLED may emit light having a certain luminance according to the driving current, in order to display images.

FIG. 2 shows an example in which the pixel circuit PC includes two thin film transistors and one storage capacitor, but one or more embodiments are not limited thereto. For example, the pixel circuit PC may include three or more thin film transistors and/or two or more storage capacitors. According to some example embodiments, the pixel circuit PC may include seven thin film transistors and one storage capacitor. The number of thin film transistors and the number of storage capacitors may vary depending on a design of the pixel circuit PC. Hereinafter, for convenience of description, an example in which the pixel circuit PC includes two thin film transistors and one storage capacitor will be described below.

Figure 4A:
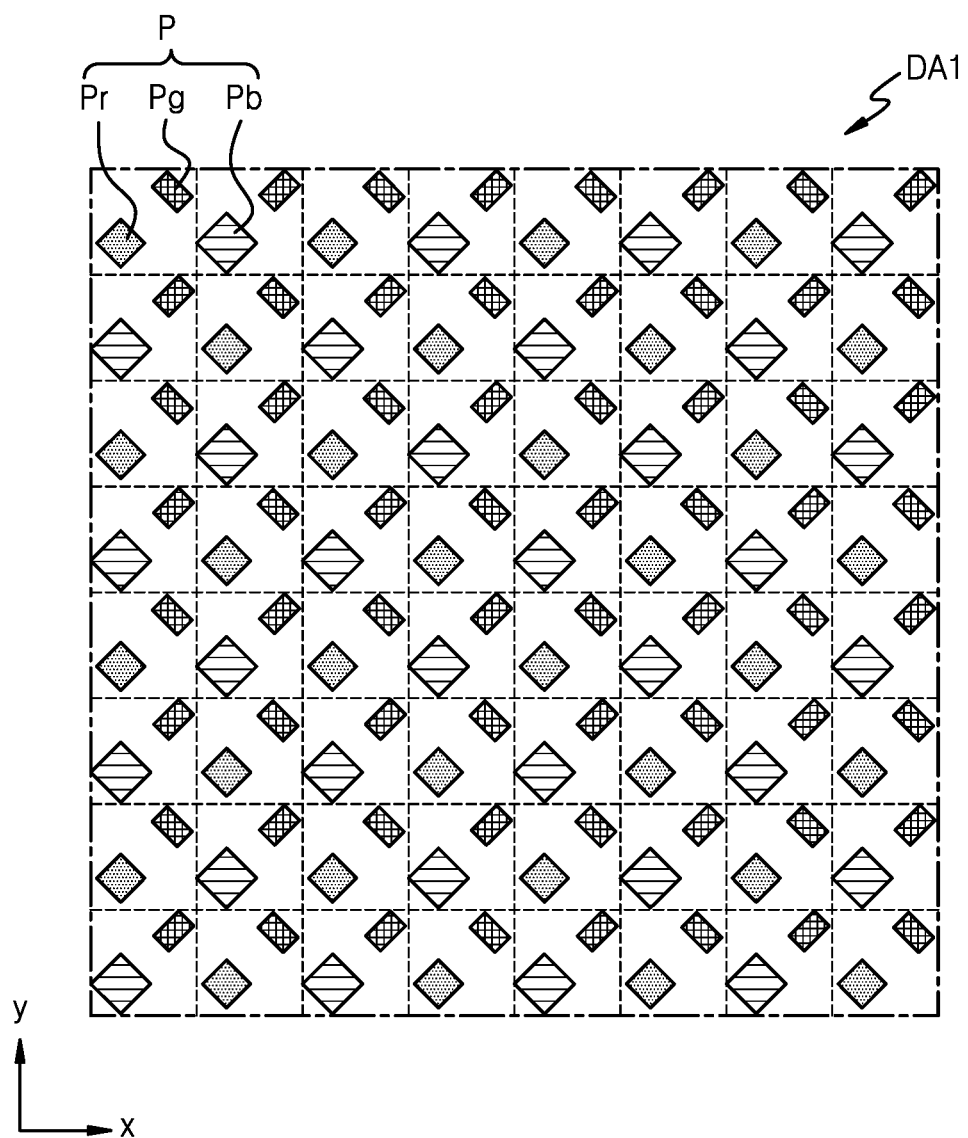
FIG. 4A is a plan view showing the arrangement of pixels in a first display area in a display device according to some example embodiments.
Figure 4B:
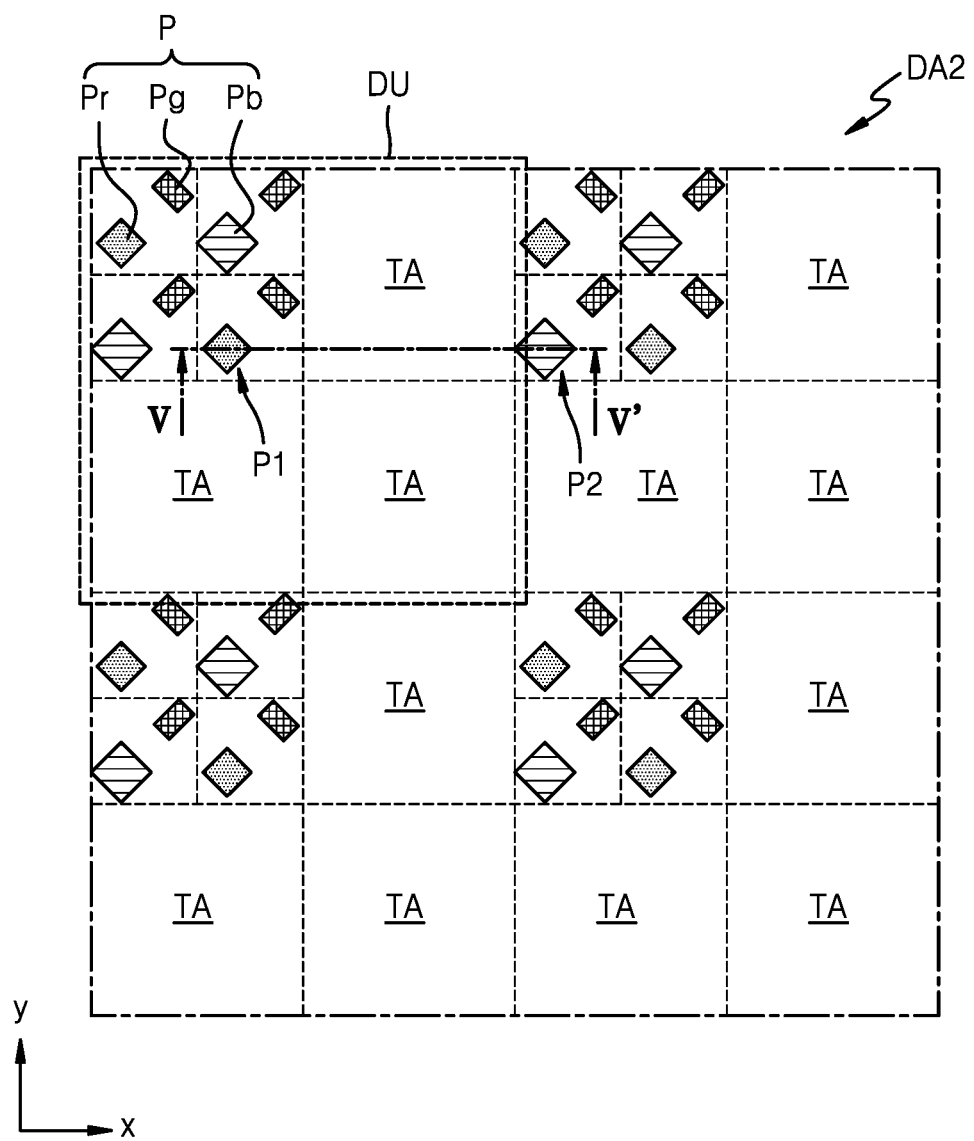
FIG. 4B is a plan view showing the arrangement of pixels in a second display area in a display device according to some example embodiments.

FIG. 4A is a plan view showing an arrangement of pixels in the first display area DA1 of the display device according to some example embodiments, and FIG. 4B is a plan view showing an arrangement of pixels in the second display area DA2 of the display device according to some example embodiments.

Referring to FIG. 4A, the pixels P are arranged in the first display area DA1. The pixels P may each include a red pixel Pr, a green pixel Pg, and a blue pixel Pb. According to some example embodiments, the red pixel Pr, the green pixel Pg, and the blue pixel Pb may be arranged in a pentile type as shown in FIG. 4A. According to some example embodiments, the red pixel Pr, the green pixel Pg, and the blue pixel Pb may be arranged in a stripe type.

The red pixel Pr, the green pixel Pg, and the blue pixel Pb may have different sizes (or widths) from one another. For example, the blue pixel Pb may be larger than the red pixel Pr and the green pixel Pg, and the red pixel Pr may be larger than the green pixel Pg. According to some example embodiments, the green pixel Pg may have a rectangular shape, and neighboring green pixels Pg may extend in different directions from one another. The relative sizes and shapes of the pixels Pr, Pg, and Pb are not limited to the sizes and shapes described above, however, and some example embodiments may include pixels having any suitable size or shape according to the design of the electronic device 1.

Referring to FIG. 4B, the second display area DA2 may include a display unit DU that is repeatedly arranged. In the second display area DA2, the display unit DU is repeatedly arranged in an x-direction and/or y-direction to make a pixel array.

The display unit DU includes the pixels P. The pixels P may each include a red pixel Pr, a green pixel Pg, and a blue pixel Pb. According to some example embodiments, the red pixel Pr, the green pixel Pg, and the blue pixel Pb may be arranged in a pentile type. According to some example embodiments, the red pixel Pr, the green pixel Pg, and the blue pixel Pb may be arranged in a stripe type.

In addition, the display unit DU of the second display area DA2 may include transmission areas TA. In the second display area DA2, the transmission area TA may be adjacent to the pixels P. For example, the transmission area TA may be between the pixels P. The pixels P in the second display area DA2 may include first pixels P1 and second pixels P2 that are separated from each other with the transmission area TA therebetween. For convenience of description, in FIG. 4A, two pixels P arranged in the x-direction are denoted as the first pixel P1 and the second pixel P2 respectively, but the pixels P arranged in the y-direction with the transmission area TA therebetween may be referred to as the first pixel P1 and the second pixel P2.

According to some example embodiments, eight pixels P may configure one pixel set in the second display area DA2, and neighboring pixel sets may be arranged with the transmission area TA therebetween. In FIG. 4B, the display unit DU includes one pixel set and three transmission areas TA arranged in an L-shape around the pixel set, but the display unit DU may include the transmission areas TA that are arranged to entirely surround a plurality of pixel sets adjacent to each other. In another example, the display unit DU may include the plurality of transmission areas TA and the plurality of pixel sets that are alternately arranged in a grating shape.

In FIG. 4B, the display unit DU includes eight pixels P, but one or more embodiments are not limited thereto. The number of pixels P included in the display unit DU may vary depending on a resolution of the second display area DA2.

In addition, because the second display area DA2 includes the transmission areas TA, the number of pixels P in the first display area DA1 may be greater than the number of pixels P per same area in the second display area DA2. That is, a resolution of the second display area DA2 may be lower than that of the first display area DA1. For example, the resolution of the second display area DA2 may be about ½, ⅜, ⅓, ¼, 2/9, ⅛, 1/9, 1/16, etc. of the resolution of the first display area DA1.

Figure 5:
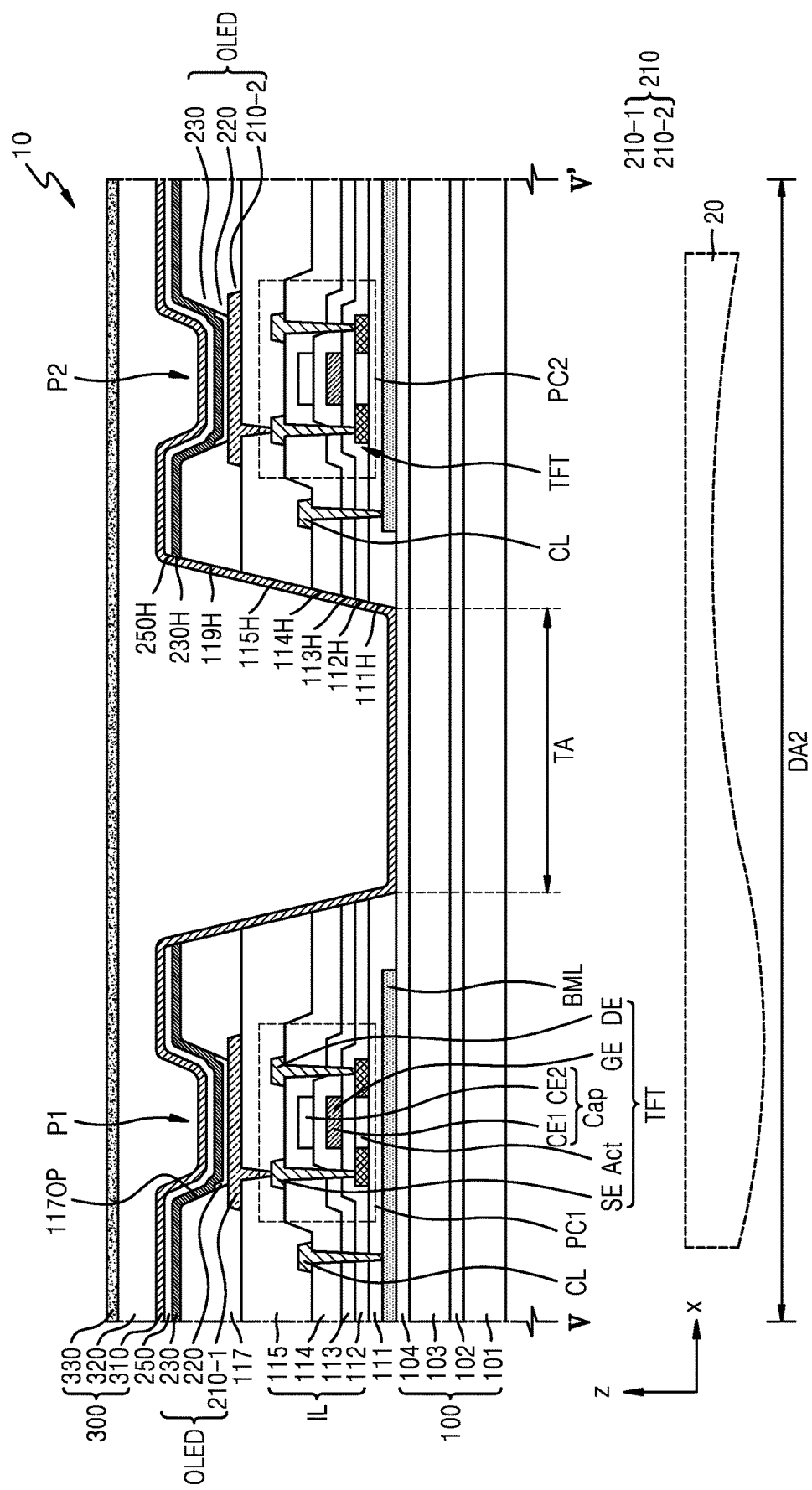
FIG. 5 is a cross-sectional view partially showing a display apparatus according to some example embodiments.

FIG. 5 is a cross-sectional view partially showing a display device according to some example embodiments.

Referring to FIG. 5, the substrate 100 may have a multi-layered structure including a base layer and an inorganic layer, the base layer including a polymer resin. For example, the substrate 100 may include the base layer including a polymer resin and a barrier layer including an inorganic insulating layer. For example, the substrate 100 may include a first base layer 101, a first barrier layer 102, a second base layer 103, and a second barrier layer 104 that are sequentially stacked in the stated order. For example, the first base layer 101 and the second base layer 103 may each include a polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc. The first barrier layer 102 and the second barrier layer 104 may each include an inorganic insulating material such as silicon oxide, silicon oxynitride, and/or silicon nitride.

A buffer layer 111 may be on the substrate 100. The buffer layer 111 may reduce or prevent infiltration of impurities, moisture, or external air from below the substrate 100, and may provide a planarized surface on the substrate 100. The buffer layer 111 may include an inorganic insulating material such as silicon oxide, silicon oxynitride, and silicon nitride, and may have a single-layered or multi-layered structure including the above stated material.

The lower metal layer BML may be between the substrate 100 and the buffer layer 111. The lower metal layer BML may be under the thin film transistor TFT of the pixel circuit PC, and may at least overlap a semiconductor layer Act in the thin film transistor TFT.

The lower metal layer BML may have a single-layered or multi-layered structure including a low-resistive conductive material such as molybdenum (Mo), aluminum (Al), copper (Cu), and/or titanium (Ti). According to some example embodiments, the lower metal layer BML may have a single-layered structure including molybdenum (Mo). According to some example embodiments, the lower metal layer BML may have a dual-layered structure including molybdenum (Mo) and titanium (Ti). In this case, titanium (Ti) may improve corrosion resistance. Also, the lower metal layer BML may include a light-blocking material, e.g., a black ink or dye.

The pixel circuit PC may be on the buffer layer 111. The pixel circuit PC may include the thin film transistor TFT and the storage capacitor Cap. For example, the display device 10 may include the pixel circuits PC on the substrate 100 in the second display area DA2, wherein the pixel circuits PC each including the thin film transistor TFT and the storage capacitor Cap are apart from each other with the transmission area TA therebetween. A first pixel circuit PC1 and a second pixel circuit PC2 may have the same structure as each other.

The thin film transistor TFT may include the semiconductor layer Act, a gate electrode GE overlapping a channel region of the semiconductor layer Act, and a source electrode SE and a drain electrode DE respectively connected to a source region and a drain region of the semiconductor layer Act. A first gate insulating layer 112 is between the semiconductor layer Act and the gate electrode GE, and a second gate insulating layer 113 and an interlayer insulating layer 114 may be between the gate electrode GE and the source electrode SE or between the gate electrode GE and the drain electrode DE.

The storage capacitor Cap may overlap the thin film transistor TFT. The storage capacitor Cap may include a first capacitor plate CE1 and a second capacitor plate CE2 overlapping each other. According to some example embodiments, the gate electrode GE of the thin film transistor TFT may include the first capacitor plate CE1 of the storage capacitor Cap. The second gate insulating layer 113 may be between the first capacitor plate CE1 and the second capacitor plate CE2.

The semiconductor layer Act may include polysilicon. According to some example embodiments, the semiconductor layer Act may include amorphous silicon. According to some example embodiments, the semiconductor layer Act may include an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region, and a source region and a drain region doped with impurities.

The first gate insulating layer 112 may include an inorganic insulating material such as silicon oxide, silicon oxynitride, or silicon nitride, and may have a single-layered or multi-layered structure including the above-stated materials.

The gate electrode GE or the first capacitor plate CE1 may have a single-layered or multi-layered structure including a low-resistive conductive material such as molybdenum (Mo), aluminum (Al), copper (Cu), and/or titanium (Ti).

The second gate insulating layer 113 may include an inorganic insulating material such as silicon oxide, silicon oxynitride, or silicon nitride, and may have a single-layered or multi-layered structure including the above-stated materials.

The second capacitor plate CE2 may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu).

The interlayer insulating layer 114 may include an inorganic insulating material such as silicon oxide, silicon oxynitride, or silicon nitride, and may have a single-layered or multi-layered structure including the above-stated materials.

The source electrode SE or the drain electrode DE may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), nickel (Ni), lithium (Li), calcium (Ca), molybdenum (Mo), titanium (Ti), tungsten (W), and/or copper (Cu). For example, the source electrode SE or the drain electrode DE may have a triple-layered structure including Ti layer/Al layer/Ti layer.

A conductive layer CL may be on the second gate insulating layer 113. The conductive layer CL may include the same material as that of the source electrode SE or the drain electrode DE. The conductive layer CL may be electrically connected to the source electrode SE or the drain electrode DE, for example, may be integrally provided with the source electrode SE or the drain electrode DE.

The conductive layer CL may be connected to the lower metal layer BML via a contact hole in the first gate insulating layer 112, the second gate insulating layer 113, and the interlayer insulating layer 114. Because the lower metal layer BML does not electrically float by receiving a constant voltage, and the thin film transistor TFT on the lower metal layer BML may have stabilized electrical characteristics. According to some example embodiments, the conductive layer CL may receive the driving voltage ELVDD from the driving voltage line PL (see FIG. 3), and the lower metal layer BML may receive the driving voltage ELVDD via the conductive layer CL. The constant voltage is not limited to the driving voltage ELVDD, that is, may include signals that are applied to control a display driver.

The pixel circuit PC including the thin film transistor TFT and the storage capacitor Cap may be electrically connected to a pixel electrode 210.

A planarization layer 115 may be on the first gate insulating layer 112, the second gate insulating layer 113, and the interlayer insulating layer 114. The planarization layer 115 may be on the thin film transistor TFT of the pixel circuit PC. For example, the planarization layer 115 may be between the thin film transistor TFT of the pixel circuit PC and the pixel electrode 210. The planarization layer 115 may include an organic insulating material. The planarization layer 115 may include an organic insulating material such as acryl, benzocyclobutene (BCB), polyimide, hexamethyldisiloxane (HMDSO), etc. The organic insulating material of the planarization layer 115 may be a photosensitive organic insulating material.

The pixel electrode 210 may be on the planarization layer 115. The pixel electrode 210 may be electrically connected to the pixel circuit PC via a contact hole in the planarization layer 115. For example, a first pixel electrode 210-1 of the first pixel P1 may be electrically connected to the first pixel circuit PC1, and a second pixel electrode 210-2 of the second pixel P2 may be electrically connected to the second pixel circuit PC2. The first pixel electrode 210-1 and the second pixel electrode 210-2 may have the same structure as each other.

The pixel electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. The pixel electrode 210 may include a reflective layer including the above-stated material, and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide, or aluminum zinc oxide (AZO). According to some example embodiments, the pixel electrode 210 may have a triple-layered structure including ITO layer/Ag layer/ITO layer that are stacked sequentially.

A pixel defining layer 117 may be on the pixel electrode 210. The pixel defining layer 117 covers edges of the pixel electrode 210 and may include an opening 117OP overlapping a central portion of the pixel electrode 210.

The pixel defining layer 117 increases a distance between an edge of the pixel electrode 210 and the opposite electrode 230 on the pixel electrode 210 to prevent generation of an arc at the edge of the pixel electrode 210. The pixel defining layer 117 may include an organic insulating material such as polyimide, polyamide, an acrylic resin, benzocyclobutene, hexamethyldisiloxane (HMDSO), and a phenol resin, and may be obtained by spin coating, etc.

An intermediate layer 220 is on the pixel defining layer 117, the intermediate layer 220 corresponding to the pixel electrode 210. The intermediate layer 220 may include a polymer or low-molecular weight organic material emitting certain color light.

An opposite electrode 230 is on the intermediate layer 220. The opposite electrode 230 may include a conductive material having a relatively low work function. For example, the opposite electrode 230 may include a (semi-)transparent layer including argentum (Ag), magnesium (Mg), aluminum (Al), nickel (Ni), chromium (Cr), lithium (Li), calcium (Ca), or an alloy thereof. Alternatively, the opposite electrode 230 may further include a layer including ITO, IZO, ZnO, or $In_2O_3$ on the (semi-)transparent layer including the above material. According to some example embodiments, the opposite electrode 230 may include argentum (Ag) and magnesium (Mg). The opposite electrode 230 may be integrally provided to entirely cover the first and second display areas DA1 and DA2 (see FIG. 10).

A stack structure of the pixel electrode 210, the intermediate layer 220, and the opposite electrode 230 may configure a light-emitting diode, e.g., organic light-emitting diode OLED. The organic light-emitting diode OLED may emit red light, green light, or blue light, and an emission area in each organic light-emitting diode OLED may correspond to the pixel P. Because the opening 117OP of the pixel defining layer 117 defines a size and/or width of the light-emitting area, the size and/or width of the pixel P may be dependent upon the size and/or width of the corresponding opening 117OP of the pixel defining layer 117.

A capping layer 250 may be on the opposite electrode 230. The capping layer 250 may include LiF. Alternatively, the capping layer 250 may include an inorganic insulating material such as silicon nitride, and/or an organic insulating material. According to some example embodiments, the capping layer 250 may be omitted.

The thin film encapsulation layer 300 may be on the capping layer 250. The organic light-emitting diode OLED may be covered by the thin film encapsulation layer 300. The thin film encapsulation layer 300 may include first and second inorganic encapsulation layers 310 and 330, and an organic encapsulation layer 320 between the first and second inorganic encapsulation layers 310 and 330.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be obtained by a chemical vapor deposition method.

The organic encapsulation layer 320 may include a polymer-based material. The polymer-based material may include an acryl-based resin, an epoxy-based resin, polyimide, polyethylene, etc. For example, the organic encapsulation layer 320 may include an acrylic-based resin, e.g., polymethyl methacrylate (PMMA), polyacrylate, etc. The organic encapsulation layer 320 may be obtained by curing a monomer or applying polymer.

An optical functional layer such as a touch input layer, an anti-reflection layer, a color filter layer, etc. and an overcoat layer may be on the thin film encapsulation layer 300.

A plurality of insulating layers between the substrate 100 and the pixel electrode 210 may each include a hole corresponding to the transmission area TA. For example, the buffer layer 111 on the substrate 100 may include a first hole 111H corresponding to the transmission area TA. The first gate insulating layer 112, the second gate insulating layer 113, the interlayer insulating layer 114, and the planarization layer 115 may respectively include second to fifth holes 112H, 113H, 114H, and 115H that are in the transmission area TA and overlap one another. In addition, the pixel defining layer 117, the opposite electrode 230, the capping layer 250, and sub-layers of the thin film encapsulation layer 300 on the pixel electrode 210 may each include a hole corresponding to the transmission area TA. For example, the pixel defining layer 117, the opposite electrode 230, the capping layer 250, and the first inorganic encapsulation layer 310 may respectively include sixth to eighth holes 119H, 230H, and 250H that are in the transmission area TA and overlap one another.

The first to eighth holes 111H, 112H, 113H, 114H, 115H, 119H, 230H, and 250H may overlap one another, and thus, the light transmittance of the transmission area TA may be improved.

Figure 6:
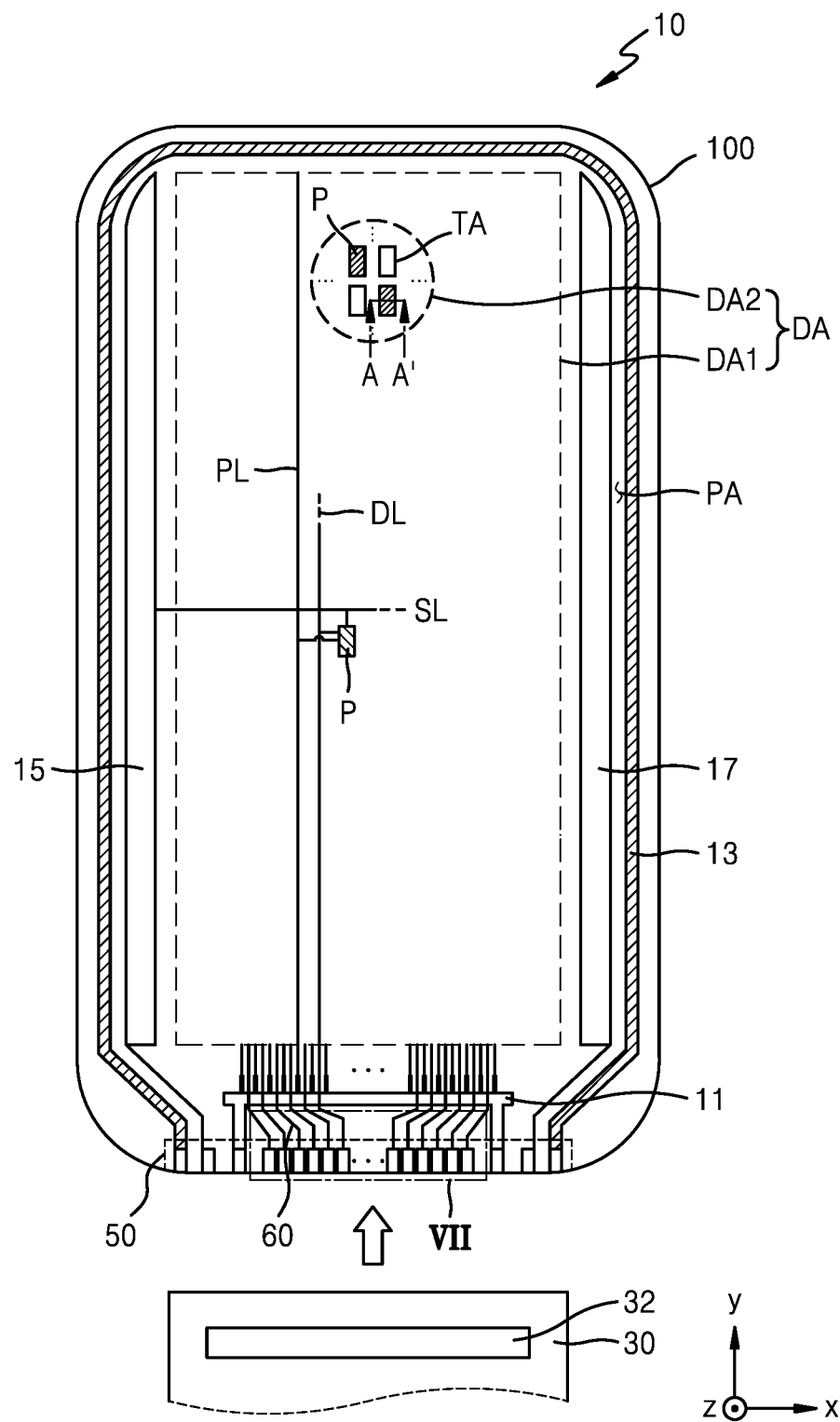
FIG. 6 is a plan view of a display device according to some example embodiments.

FIG. 6 is a plan view of the display device 10 according to some example embodiments.

Referring to FIG. 6, various elements in the display device 10 may be on the substrate 100. The pixel circuits PC (see FIG. 5) respectively corresponding to the pixels P and a plurality of signal lines passing over the display area DA may be on the substrate 100. Each of the pixel circuits PC may be electrically connected to external circuits in the peripheral area PA. The peripheral area PA may include a first scan driving circuit 15, a second scan driving circuit 17, a pad portion 50, a driving voltage supply line 11, a common voltage supply line 13, and a fan-out wiring portion 60 electrically connecting the pad portion 50 to the signal lines.

The first scan driving circuit 15 may apply the scan signal Sn (see FIG. 3) to each of the pixel circuits PC corresponding to the pixels P, via the scan line SL passing through the display area DA. The second scan driving circuit 17 may be opposite to the first scan driving circuit 15 based on the first display area DA1, and may be in parallel with the first scan driving circuit 15. Some of the pixel circuits PC in the first display area DA1 may be electrically connected to the first scan driving circuit 15, and the other pixel circuits PC may be electrically connected to the second scan driving circuit 17. Some of the pixel circuits PC in the second display area DA2 may be electrically connected to the first scan driving circuit 15, and the other pixel circuits PC may be electrically connected to the second scan driving circuit 17. The second scan driving circuit 17 may be omitted.

The pad portion 50 may be at a side of the substrate 100. The pad portion 50 is not covered by the insulating layer, but is exposed to be connected to a display circuit board 30. A display driver 32 may be on the display circuit board 30. The display driver 32 may generate a control signal transferred to the first scan driving circuit 15 and the second scan driving circuit 17. Also, the display driver 32 may supply the driving voltage ELVDD (see FIG. 3) to the driving voltage supply line 11 and may supply the common voltage ELVSS (see FIG. 3) to the common voltage supply line 13. The driving voltage ELVDD is applied to the pixel circuit PC via the driving voltage line PL connected to the driving voltage supply line 11, and the common voltage ELVSS is connected to the common voltage supply line 13 to be applied to the opposite electrode of the light-emitting element. The display driver 32 generates a data signal that may be transferred to the pixel circuit PC via the fan-out wiring portion 60 and the data line DL connected to the fan-out wiring portion 60 and passing through the display area DA.

The driving voltage supply line 11 may extend in the x-direction under the first display area DA1. The common voltage supply line 13 may have a loop shape having one open side to partially surround the first display area DA1.

Figure 7:
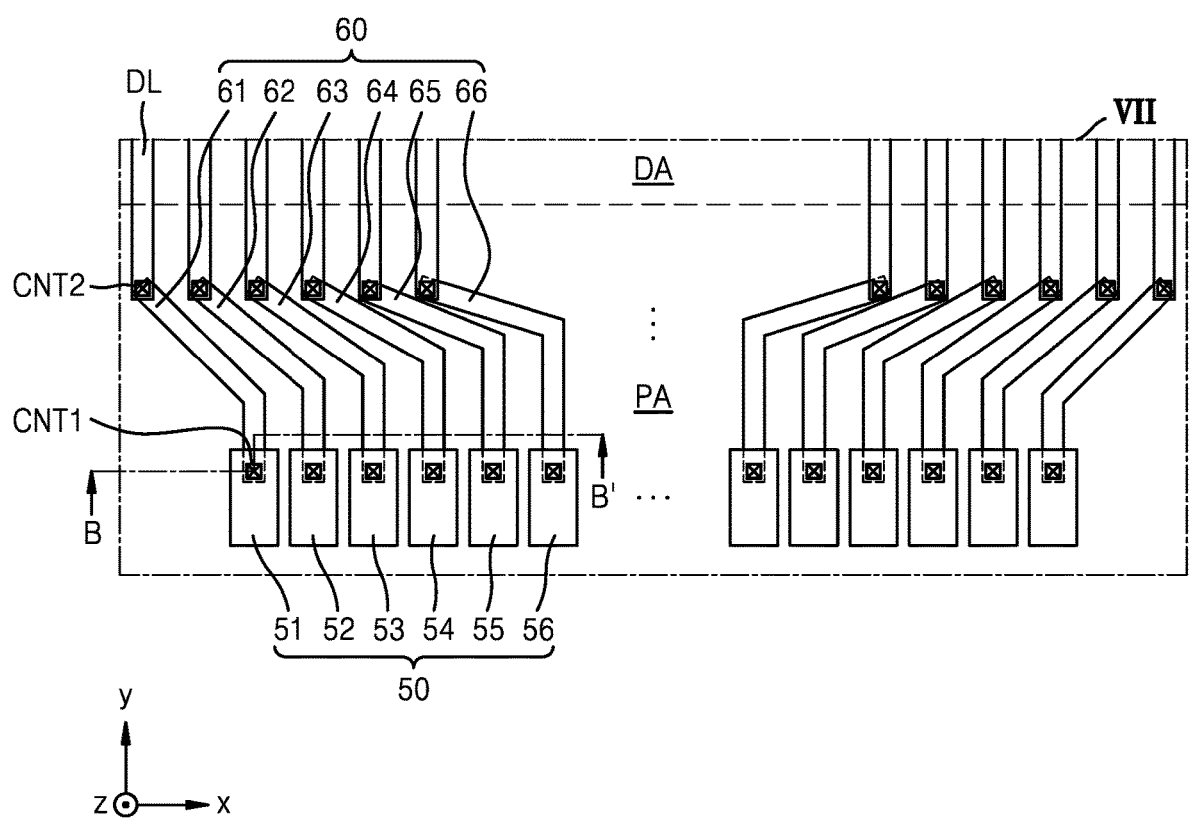
FIG. 7 is a plan view showing an enlarged view of a portion in the display device of FIG. 6.

FIG. 7 is a plan view showing an enlarged view of a portion in the display device 10 of FIG. 6.

Referring to FIG. 7, the display device 10 according to some example embodiments includes a pad portion 50 in the peripheral area PA, and the pad portion 50 may include a plurality of pads 51 to 56. The pad portion 50 may be electrically connected to the fan-out wiring portion 60 via a first contact hole CNT1. The fan-out wiring portion 60 may include a plurality of fan-out wirings 61 to 66. The plurality of fan-out wirings 61 to 66 are respectively connected to a plurality of signal lines passing through the display area DA via a second contact hole CNT2, and may be configured to transfer electrical signals from the plurality of pads 51 to 56 of the pad portion 50 to the pixel circuits PC of the display area DA. For example, the signal lines may be the data lines DL, and the electrical signal may be the data signal Dm.

The plurality of pads 51 to 56 may be arranged in the x-direction with certain intervals therebetween. In FIG. 7, centers of the plurality of pads 51 to 56 are arranged on the same line in the x-direction, but one or more embodiments are not limited thereto. The centers of the pads 51 to 56 may be arranged in zig-zags in the x-direction, and may be variously modified.

The fan-out wirings 61 to 66 may be respectively connected to the pads 51 to 56, and directions in which at least some of the fan-out wirings 61 to 66 extend may be different from one another. That is, the fan-out wirings 61 to 66 may extend in various angles with respect to the x-direction.

The pads 51 to 56 of the pad portion 50 and the fan-out wiring 61 to 66 may be at different layers from each other. Accordingly, the fan-out wirings 61 to 66 may be respectively connected to the pads 51 to 56 via contact holes.

Figure 8A:
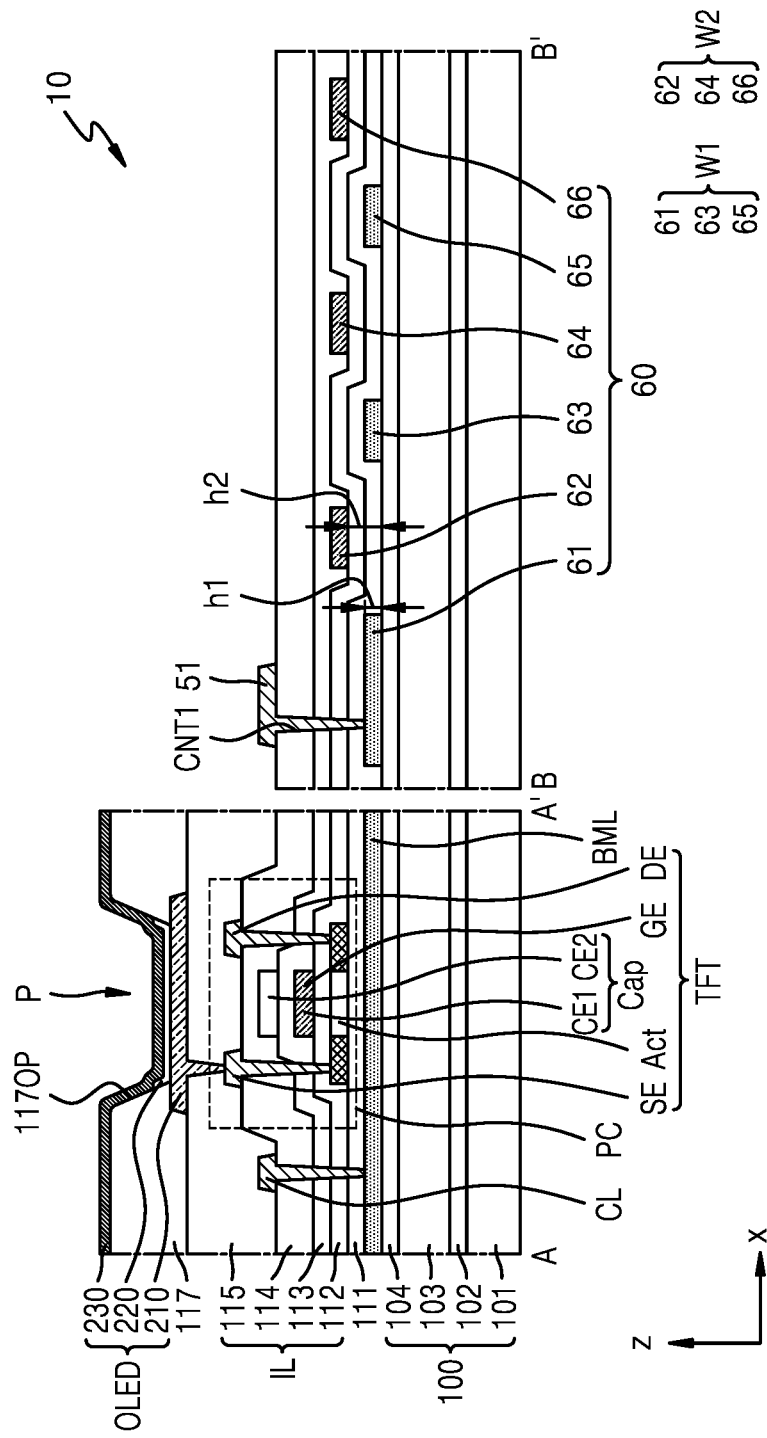
Figure 8B:
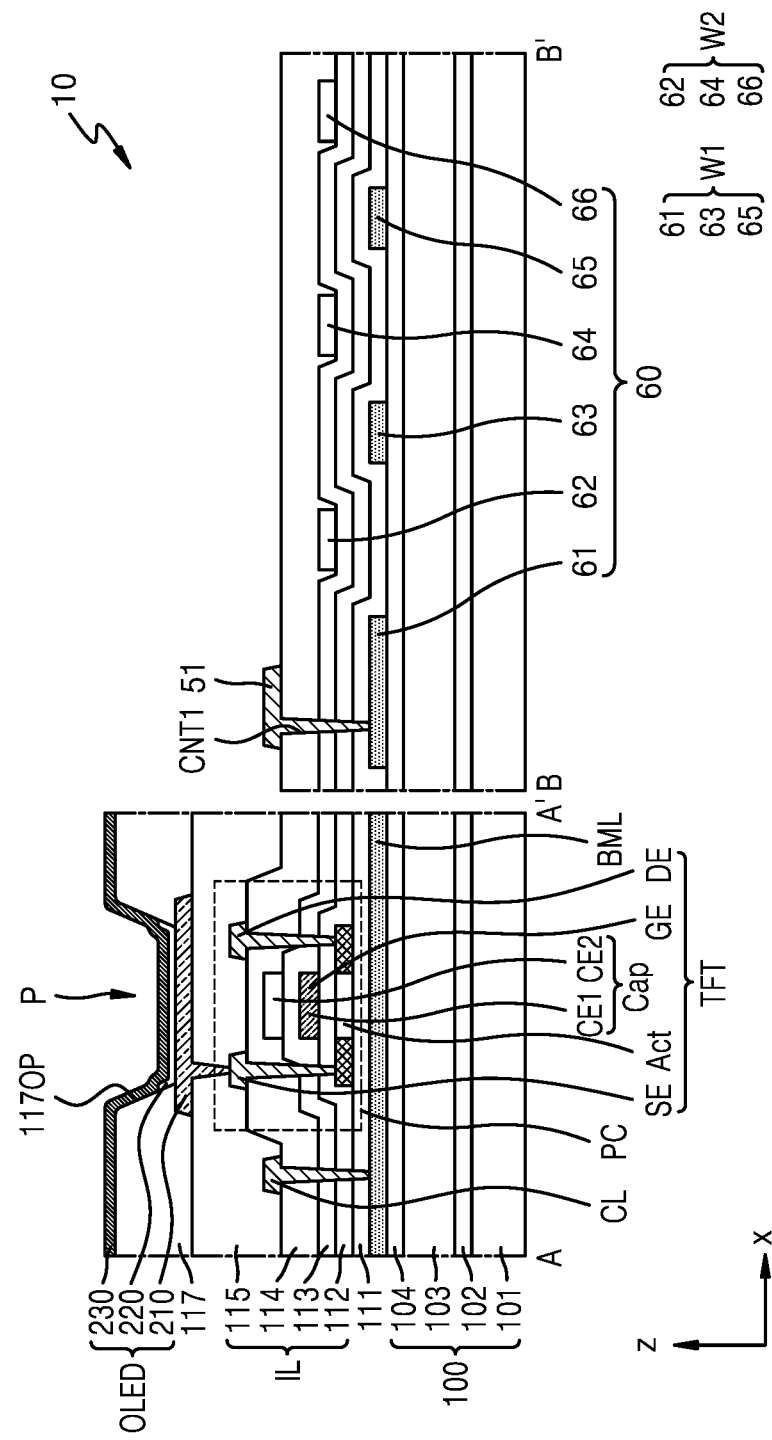

FIGS. 8A to 8C are cross-sectional views of a portion of the display device 10 according to one or more embodiments. FIGS. 8A to 8C may correspond to cross-sections of the display device taken along line A-A' of FIG. 6 and line B-B' of FIG. 7.

Referring to FIG. 8A, from among the fan-out wirings 61 to 66 of the fan-out wiring portion 60, the first fan-out wiring 61, the third fan-out wiring 63, and the fifth fan-out wiring 65 are on the substrate 100 and may be at the same layer as that of the lower metal layer BML. The first, third, and fifth fan-out wirings 61, 63, and 65 that are at the same layer may be defined as a first wiring layer W1. The first wiring layer W1 may include the same material as that of the lower metal layer BML. For example, the first wiring layer W1 may have a single-layered structure including molybdenum (Mo). In another example, the first wiring layer W1 may have a dual-layered structure including molybdenum (Mo) and titanium (Ti). In this case, titanium (Ti) may improve corrosion resistance.

From among the fan-out wirings 61 to 66, the second fan-out wiring 62, the fourth fan-out wiring 64, and the sixth fan-out wiring 66 may be at the same layer as each other and may be defined as a second wiring layer W2. The second wiring layer W2 may be on the first wiring layer W1 with an insulating layer therebetween. The insulating layer may include an inorganic insulating material. According to some example embodiments, the insulating layer may be the buffer layer 111 or the first gate insulating layer 112, and according to some example embodiments, the insulating layer may include both the buffer layer 111 and the first gate insulating layer 112. The insulating layer is in both the display area DA and the peripheral area PA, and may be between the first wiring layer W1 and the second wiring layer W2 and between the substrate 100 and the pixel circuits PC.

A lower surface of the second wiring layer W2 may be farther from the substrate 100 than an upper surface of the first wiring layer W1. That is, a first height h1 from the front surface of the substrate 100 to the upper surface of the first wiring layer W1 may be less than a second height h2 from the front surface of the substrate 100 to the lower surface of the second wiring layer W2. As such, as described in more detail later with reference to FIG. 10, the first wiring layer W1 and the second wiring layer W2 may overlap each other.

The second wiring layer W2 may include the same material as the gate electrode GE and/or the first capacitor plate CE1, for example, the second wiring layer W2 may have a single-layered structure including molybdenum (Mo). According to some example embodiments, the second wiring layer W2 may have a dual-layered structure including molybdenum (Mo) and titanium (Ti). In this case, titanium (Ti) may improve corrosion resistance.

The first pad 51 of the pad portion 50 may be electrically connected to the first fan-out wiring 61 via a contact hole CNT formed in at least one insulating layer on the first fan-out wiring 61. According to some example embodiments, the second to sixth pads 52 to 56 may be also electrically connected to the second to sixth fan-out wirings 62 to 66 via contact holes.

Referring to FIG. 8B, at least two insulating layers may be between the first wiring layer W1 and the second wiring layer W2. For example, the buffer layer 111, the first gate insulating layer 112, and the second gate insulating layer 113 may be between the first wiring layer W1 and the second wiring layer W2, or the buffer layer 111 and the second gate insulating layer 113 may be between the first wiring layer W1 and the second wiring layer W2. In this case, the second wiring layer W2 may include the same material as that of the second capacitor plate CE2. For example, the second wiring layer W2 may have a single-layered structure including molybdenum (Mo). In another example, the second wiring layer W2 may have a dual-layered structure including molybdenum (Mo) and titanium (Ti). In this case, titanium (Ti) may improve corrosion resistance.

The plurality of fan-out wirings of the fan-out wiring portion 60 may occupy a large space in the peripheral area PA, and accordingly, a dead space may increase. Attempts to densely arrange the fan-out wirings have been made in order to reduce the dead space. When the fan-out wirings are densely arranged at the same layer, defects may occur due to short-circuits between adjacent fan-out wirings in a plane. In order to reduce a probability that defects occur, from among the fan-out wirings 61 to 66, fan-out wirings adjacent to each other on a plane may be arranged at different layers from one another according to one or more embodiments.

In addition, in a comparative example, some of the fan-out wirings may be at the same layer as that of the gate electrode and/or the first capacitor plate, and the others may be at the same layer as that of the second capacitor plate. In this case, the some fan-out wirings and the other fan-out wirings may be alternately arranged in a plane. A first inorganic insulating layer (e.g., a gate insulating layer) may be between the some fan-out wirings and the other fan-out wirings, and a second inorganic insulating layer (e.g., an interlayer insulating layer) may be on the fan-out wirings to cover the fan-out wirings.

In the comparative example, because the first inorganic insulating layer and the second inorganic insulating layer are thin and are sequentially stacked, when the some fan-out wirings and the other fan-out wirings are densely arranged, deep valleys may be generated on the second inorganic insulating layer. In this case, during processes of applying and patterning a metal layer (e.g., a metal layer that is the same as the source electrode and/or drain electrode) on the second inorganic insulating layer, the metal layer may not be completely removed from the valleys but a remaining layer may be obtained. This may cause short-circuits between the fan-out wirings. However, according to one or more embodiments, some of the fan-out wirings 61 to 66 are at the same layer as that of the lower metal layer BML, and thus, the interlayer insulating layer 114 on the fan-out wirings 61 to 66 may be relatively flat, and thus, generation of the valleys and the remaining layer may be reduced.

Also, in the comparative example, a thin first inorganic insulating layer is only between the adjacent fan-out wirings. When heat is applied to the inorganic insulating layer during the manufacturing of the display device, for example, when the substrate and an encapsulation substrate are bonded to each other, a sealing material is applied and a laser beam is radiated in order to encapsulate the inner space between the substrate and the encapsulation substrate, the first inorganic insulating layer may be thermally expanded and isolation may occur. As the fan-out wirings are densed, the probability of generating the isolation may increase. Thus, short-circuits may occur among the fan-out wirings, which may cause product failure. However, according to one or more example embodiments, two or more insulating layers are between the adjacent fan-out wirings, and thus, even when the fan-out wirings are densely arranged, the probability of generating the isolation due to the thermal expansion may be reduced due to a sufficient thickness of the insulating layers.

Referring to FIG. 8C, from among the fan-out wirings 61 to 66 of the fan-out wiring portion 60, the first fan-out wiring 61, the third fan-out wiring 63, and the fifth fan-out wiring 65 are on the substrate 100 and may be at the same layer as that of the lower metal layer BML. The first, third, and fifth fan-out wirings 61, 63, and 65 that are at the same layer may be defined as the first wiring layer W1. From among the fan-out wirings 61 to 66, the second fan-out wiring 62 and the fifth fan-out wiring 65 may be at the same layer as each other and may be defined as a second wiring layer W2. From among the fan-out wirings 61 to 66, the fourth fan-out wiring 64 may be at a different layer from those of the first and second wiring layers W1 and W2, and may be defined as a third wiring layer W3.

The second wiring layer W2 may be on the first wiring layer W1 such that a first insulating layer may be between the first and second wiring layers W1 and W2, and the third wiring layer W3 may be on the second wiring layer W2 such that a second insulating layer may be between the second and third wiring layers W2 and W3. The first and second insulating layers may include an inorganic insulating material. According to some example embodiments, the buffer layer 111 and/or the first gate insulating layer 112 may be between the first wiring layer W1 and the second wiring layer W2, and the second gate insulating layer 113 may be between the second wiring layer W2 and the third wiring layer W3. That is, the first insulating layer may include the buffer layer 111 and/or the first gate insulating layer 112, and the second insulating layer may include the second gate insulating layer 113.

The first wiring layer W1 may include the same material as that of the lower metal layer BML. The second wiring layer W2 may include the same material as that of the gate electrode GE and/or the first capacitor plate CE1. The third wiring layer W3 may include the same material as that of the second capacitor plate CE2.

According to some example embodiments, in a plane, the fan-out wirings of the first wiring layer W1 may be between the fan-out wiring of the second wiring layer W2 and the fan-out wiring of the third wiring layer W3, wherein the fan-out wirings of the second and third wiring layers W2 and W3 are adjacent to each other. For example, in a plan view, the third fan-out wiring 63 at the same layer as the lower metal layer BML may be between the second fan-out wiring 62 at the same layer as the gate electrode GE and the fourth fan-out wiring 64 at the same layer as the second capacitor plate CE2.

As such, because two or more insulating layers are between the adjacent fan-out wirings 61 to 66 or the fan-out wirings 61 to 66 are sufficiently apart from one another in a stack direction (e.g., z-direction), the remaining layer on the interlayer insulating layer or the isolation due to the thermal expansion of the inorganic insulating layer may be reduced, and at the same time, the fan-out wirings may be densely arranged.

Figure 9:
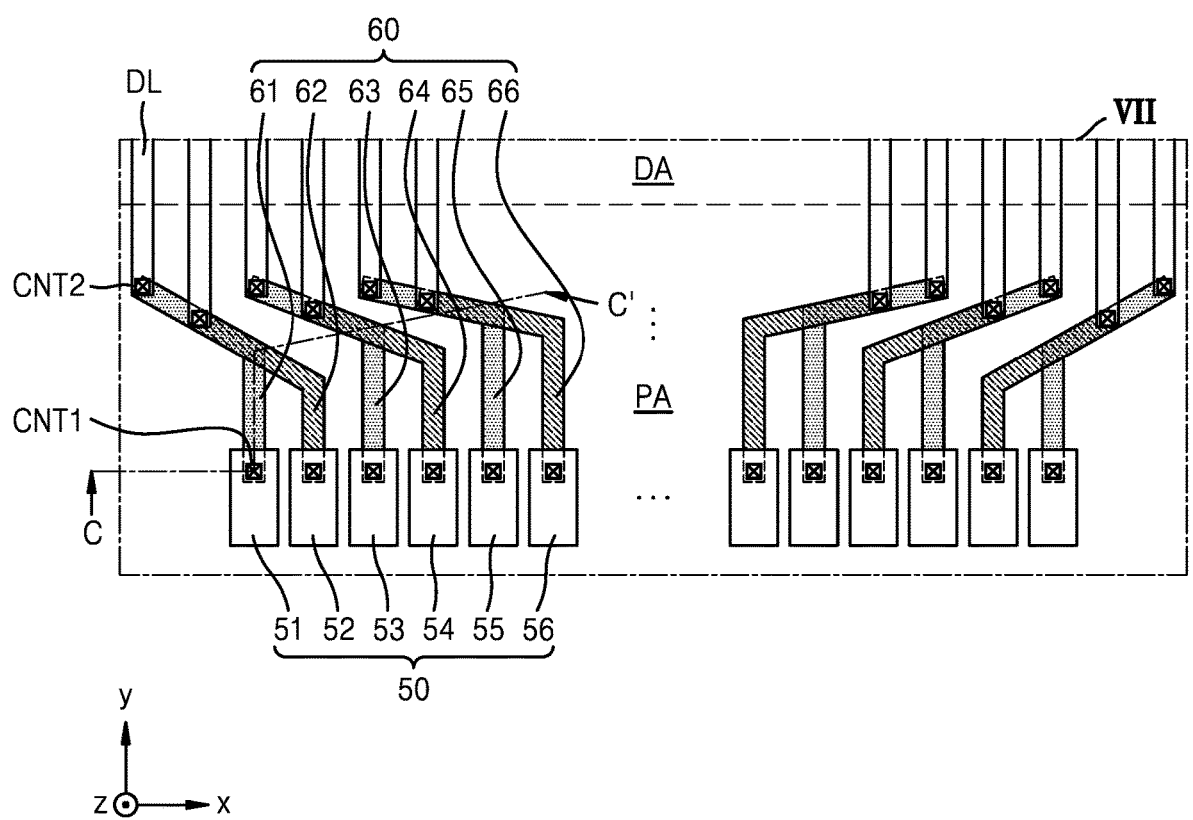
FIG. 9 is a plan view showing an enlarged view of a portion in a display device according to some example embodiments.

FIG. 9 is a plan view showing an enlarged view of a portion in the display device 10 according to some example embodiments.

Referring to FIG. 9, some of the fan-out wirings 61 to 66 in the display device 10 according to some example embodiments may overlap adjacent other fan-out wirings. For example, the first fan-out wiring 61 connected to the first pad 51 may at least partially overlap the second fan-out wiring 62 that is connected to the second pad 52 adjacent to the first pad 51. As such, an occupied area of the fan-out wirings in the peripheral area PA may be reduced.

Figure 10:
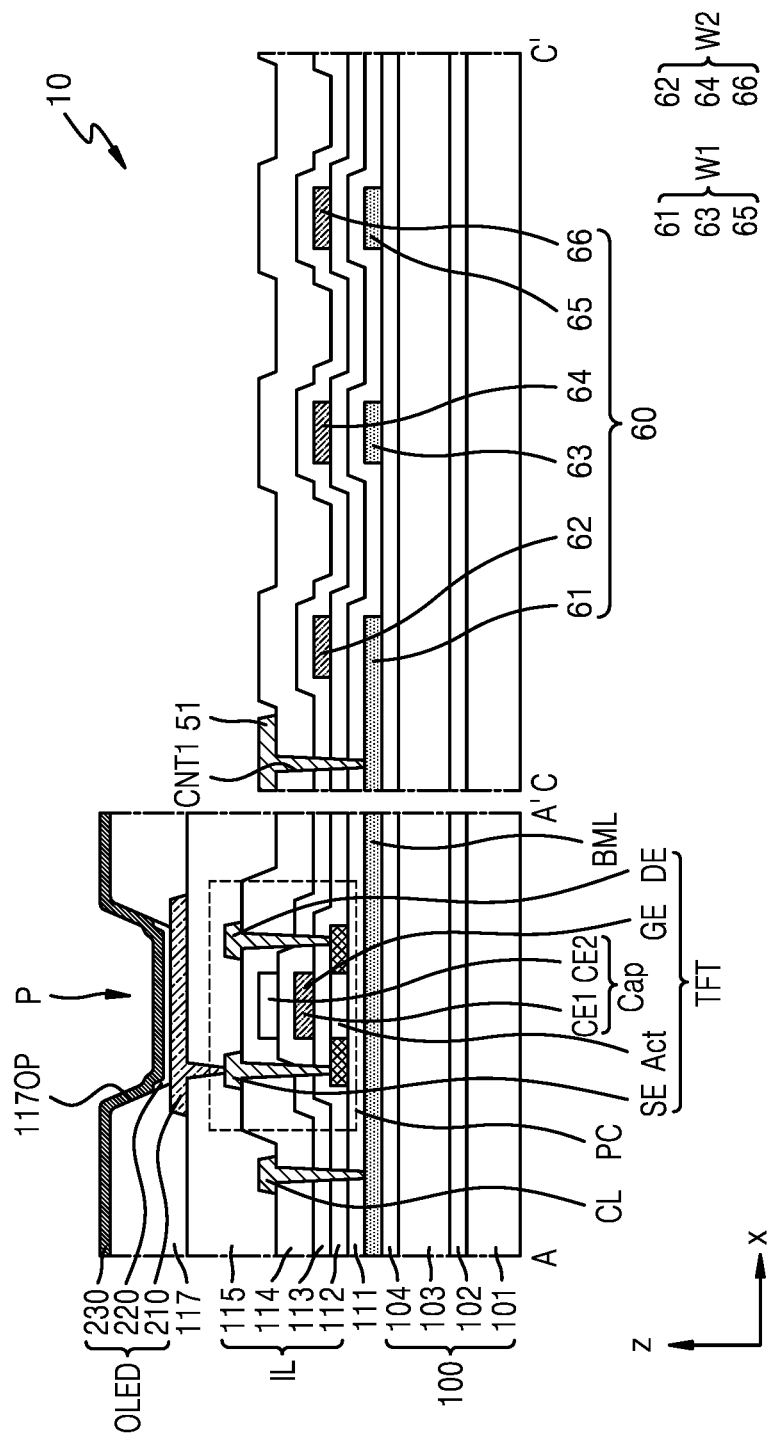
FIG. 10 is a cross-sectional view partially showing a display apparatus according to some example embodiments.

FIG. 10 is a cross-sectional view partially showing the display device 10 according to some example embodiments. FIG. 10 may correspond to a cross-section of the display device taken along the wiring A-A' of FIG. 6 and the wiring C-C' of FIG. 9. Descriptions about the same elements as those shown in FIG. 8A may be omitted, and differences will be described in more detail below.

Referring to FIG. 10, from among the fan-out wirings 61 to 66, the first wiring layer W1 and the second wiring layer W2 may overlap each other. As such, the space in which the fan-out wirings 61 to 66 may be reduced, and the dead space may be reduced. In addition, more fan-out wirings 61 to 66 may be arranged in the same area.

In a comparative example, when some of the fan-out wirings are at the same layer as the gate electrode and/or the first capacitor plate and the other fan-out wirings are at the same layer as the second capacitor plate, although some fan-out wirings and the other fan-out wirings are at the different layers from each other, the inorganic insulating layer between some fan-out wirings and the other fan-out wirings is thin, and thus, the fan-out wiring may not overlap one another. However, according to one or more embodiments, because some of the fan-out wirings 61 to 66 are at the same layer as the lower metal layer BML, a lower surface of the second wiring layer W2 may be higher than an upper surface of the first wiring layer W1 based on the substrate 100. Therefore, the first wiring layer W1 and the second wiring layer W2 may overlap each other.

The display device and the electronic device including the display device have been described, but the disclosure is not limited thereto. For example, a method of manufacturing the display device and the electronic device may be also included in the scope of the disclosure.

In the display device and the electronic device including the display device according to one or more embodiments described above, the dead space generated due to the fan-out wiring portion in the peripheral area may be reduced, and the remaining layer and the isolation that may be caused when the fan-out wirings are densely arranged may be prevented to reduce the defects caused by the short-circuits among the fan-out wirings. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device having a display area and a peripheral area adjacent to the display area, the display device comprising:
    a substrate;
    a plurality of pixel circuits in the display area, the pixel circuits each comprising a thin film transistor and a capacitor, the thin film transistor including a semiconductor layer and a gate electrode on the substrate and the capacitor including a first capacitor plate and a second capacitor plate;
    a plurality of signal lines electrically connected to the pixel circuits, the signal lines passing through the display area;
    a lower metal layer between the substrate and at least one of the pixel circuits;
    a pad portion in the peripheral area; and
    a plurality of wirings in the peripheral area, the plurality of wirings electrically connecting the pad portion to the signal lines,
    wherein the plurality of wirings further comprise:
    a first wiring at a same layer as the lower metal layer; and
    a second wiring above the first wiring with a first insulating layer between the first wiring and the second wiring,
    wherein a first portion of the first insulating layer is between the first wiring and the second wiring, and a second portion of the first insulating layer is between the substrate and the pixel circuits.

2. The display device of claim 1, wherein the first wiring includes a same material as a material included in the lower metal layer.

3. The display device of claim 1, wherein the second wiring includes a same material as a material included in the gate electrode, the first capacitor plate, or the second capacitor plate.

4. The display device of claim 1, wherein the plurality of wirings include molybdenum (Mo) and/or titanium (Ti).

5. The display device of claim 1, wherein the first wiring and the second wiring overlap each other.

6. The display device of claim 1, wherein a lower surface of the second wiring is further from the substrate than an upper surface of the first wiring.

7. The display device of claim 1, wherein the first insulating layer includes an inorganic insulating material.

8. The display device of claim 1, wherein the thin film transistor of at least one of the pixel circuits comprises a semiconductor layer, a gate electrode overlapping a channel region of the semiconductor layer, and an electrode connected to a source region or a drain region that are at opposite sides of the channel region in the semiconductor layer.

9. A display device having a display area and a peripheral area adjacent to the display area, the display device comprising:
    a substrate;
    a plurality of pixel circuits in the display area, the pixel circuits each comprising a thin film transistor and a capacitor, the thin film transistor including a semiconductor layer and a gate electrode on the substrate and the capacitor including a first capacitor plate and a second capacitor plate;
    a plurality of signal lines electrically connected to the pixel circuits, the signal lines passing through the display area;
    a lower metal layer between the substrate and at least one of the pixel circuits;
    a pad portion in the peripheral area; and
    a plurality of wirings in the peripheral area, the plurality of wirings electrically connecting the pad portion to the signal lines,
    wherein the plurality of wirings further comprise:
    a first wiring at a same layer as the lower metal layer; and
    a second wiring above the first wiring with a first insulating layer between the first wiring and the second wiring,
    wherein the plurality of wirings further comprise a third wiring above the second wiring with a second insulating layer between the second wiring and the third wiring.

10. The display device of claim 9, wherein the second wiring includes a same material as a material included in the gate electrode or the first capacitor plate, and the third wiring includes a same material as a material included in the second capacitor plate.

11. The display device of claim 9, wherein the second insulating layer includes an inorganic insulating material.

12. The display device of claim 9, wherein, in a plan view, the first wiring is between the second wiring and the third wiring that are adjacent to each other.

13. An electronic device comprising:
a display device comprising a display area and a peripheral area adjacent to the display area, the display area including a transmission area; and
an electronic component at least overlapping the transmission area,
wherein the display device comprises:
a substrate;
a first pixel circuit and a second pixel circuit each comprising a thin film transistor and a storage capacitor, the first pixel circuit and the second pixel circuit being apart from each other with the transmission area therebetween on the display area;
a first light-emitting element and a second light-emitting element that are electrically connected to the first pixel circuit and the second pixel circuit respectively;
a lower metal layer under the first pixel circuit and the second pixel circuit;
a plurality of signal lines passing through the display area, the plurality of signal lines comprising a first signal line and a second signal line applying electrical signals respectively to the first pixel circuit and the second pixel circuit;
a pad in the peripheral area; and
a plurality of wirings in the peripheral area, the plurality of wirings electrically connecting the plurality of signal lines to the pad,
wherein the plurality of wirings comprise:
a first wiring including a same material as a material included in the lower metal layer; and
a second wiring on the first wiring.

14. The electronic device of claim 13, further comprising at least one insulating layer between the first wiring and the second wiring,
wherein a portion of the at least one insulating layer is between the substrate and the first and second pixel circuits.

15. The electronic device of claim 13, wherein the thin film transistor comprises a semiconductor layer and a gate electrode overlapping the semiconductor layer,
the storage capacitor comprises a first capacitor plate and a second capacitor plate overlapping each other, and
the second wiring includes a material that is same as a material included in the gate electrode, the first capacitor plate, or the second capacitor plate.

16. The electronic device of claim 15, wherein the plurality of wirings further comprise a third wiring on the first wiring and the second wiring,
the second wiring includes a same material as a material included in the gate electrode or the first capacitor plate, and
the third wiring includes a same material as a material included in the second capacitor plate.

17. The electronic device of claim 16, wherein, in a plan view, the first wiring is between the second wiring and the third wiring that are adjacent to each other.

18. The electronic device of claim 13, wherein the first wiring and the second wiring overlap each other.

19. The electronic device of claim 13, wherein the plurality of wirings include molybdenum (Mo) and/or titanium (Ti).

* * * * *